United States Patent [19]

Nakada

[11] Patent Number: 5,148,396
[45] Date of Patent: Sep. 15, 1992

[54] SEMICONDUCTOR INTEGRATED CIRCUIT MEMORY ENABLING MEMORY WRITE MASKING

[75] Inventor: Kazuhiro Nakada, Tokyo, Japan

[73] Assignee: NEC Corporation, Tokyo, Japan

[21] Appl. No.: 485,693

[22] Filed: Feb. 27, 1990

[30] Foreign Application Priority Data

Feb. 27, 1989 [JP]  Japan .................................. 1-45824

[51] Int. Cl.⁵ ........................ G11C 7/00; G11C 8/00
[52] U.S. Cl. ............................... 365/189.03; 365/49; 365/238.5; 365/230.06
[58] Field of Search ...................... 365/49, 230.06, 49, 365/230.03, 189.03, 219, 220, 238.5, 120

[56] References Cited

U.S. PATENT DOCUMENTS

| | | |
|---|---|---|
| 4,618,947 | 10/1986 | Tran et al. .................... 365/238.5 X |
| 4,744,053 | 5/1988 | Luhrmann ............................ 365/49 |
| 4,876,671 | 10/1989 | Norwood et al. ........... 365/238.5 X |
| 4,879,692 | 11/1989 | Tokushige ................... 365/238.5 X |
| 4,902,917 | 2/1990 | Simpson ..................... 365/189.03 X |
| 4,907,203 | 3/1990 | Wada et al. ................ 365/189.03 X |
| 4,943,962 | 7/1990 | Imamiya et al. ............ 365/238.5 X |

Primary Examiner—Alyssa H. Bowler
Attorney, Agent, or Firm—Sughrue, Mion, Zinn, Macpeak & Seas

[57] ABSTRACT

Write data lines and write amplifier enable signal lines are connected to write amplifiers of a semiconductor memory device which can be switched between one-bit input and output mode configuration and multi-bit input and output mode configuration by the shared use of a single chip. Write mask data for memory write mask is supplied to the write amplifiers by the write amplifier enable signal lines.

4 Claims, 6 Drawing Sheets

SEMICONDUCTOR INTEGRATED CIRCUIT MEMORY ENABLING MEMORY WRITE MASKING

BACKGROUND OF THE INVENTION

1. Field of the Invention

The present invention relates to a semiconductor integrated circuit (IC) memory (referred to as "semiconductor memory device" hereinafter), and more particularly to a semiconductor memory device which may be used by switching in a one-bit input and output mode as well as in a multi-bit input and output mode with the shared use of a single chip, and enables memory write masking.

2. Description of the Prior Art

The majority of the semiconductor memory devices in the early days had the one-bit input and output mode configuration which input or output only one-bit data primarily for the purpose of suppressing an increase in the number of IC pins. However, mass storage has been accelerated as the application field of the semiconductor memory devices has expanded with the improvement in the level of integration, and devices have been developed with multi-bit input and output mode configuration which simultaneously inputs or outputs data with a plurality of bits. In such a semiconductor memory device, the same address terminal is multiply used in time series for a row address signal and for a column address signal, and the same terminal is used for data input and for data output by switching between them.

Now, under the semiconductor development race which has become increasingly vehement in recent years, it is becoming general to adopt a technique in which there is arranged a circuit necessary for both one-bit input and output mode configuration (abbreviated as one-bit configuration hereinafter) and multi-bit input and output mode configuration (abbreviated as multi-bit configuration hereinafter), and these configurations are changed by switching between them with a bonding or a mask. It is to be noted that even for a semiconductor memory device to be used in the one-bit configuration such a technique is effective at the time of testing in reducing the test time, which has been recognized as a problem that accompanies the advancement in the level of integration, by giving the device the multi-bit configuration. In a semiconductor memory device of this technique the multi-bit configuration is dealt with by providing write amplifiers in a number at least equal to that of the bits that can be written simultaneously, and a selector that selects one write amplifier based on the address signals is provided to handle the case of one-bit configuration.

In the semiconductor memory devices of the multi-bit configuration, such as in the case used as a RAM for an image in CRT or the like, there arise many instances in which there is required a memory write masking function which can invalidate the information writing to, that is, which can write mask every one of the bits. Conventionally, memory write masking is executed by providing write mask data input circuits corresponding to the respective write amplifiers that input write mask data from data input terminals and supply them to write amplifiers at the time of multi-bit configuration, and a write mask decoder which decodes the address signals that are identical to the address signals that are supplied to the selector, and supplies a write amplifier enable signal to one of the write amplifiers only at the time of one-bit configuration. In other words, write masking is executed by inputting write mask data that are not subjected to address selection within the semiconductor memory device and a write amplifier enable signal that is subjected to address selection within the semiconductor memory device, to the write amplifiers.

Accordingly, there are required a large number of control signal lines for write amplifiers, and from the layout design for the semiconductor memory devices the write amplifiers are arranged substantially removed from the write mask data input circuits and the write mask decoder. Because of this, the wiring area becomes large which has been a serious obstacle to the miniaturization effort for the semiconductor memory device. Moreover, an increase in the wiring area leads to an increase in the parasitic capacitance which also gives rise to a problem in conjunction with the effort for enhancing the operational performance.

SUMMARY OF THE INVENTION

Accordingly, it is a first object of the present invention to provide a semiconductor memory device with reduced area for the wiring.

It is a second object of the present invention to provide a semiconductor memory device which can realize the miniaturization.

Furthermore, it is a third object of the present invention to provide a semiconductor memory device which can realize an enhancement of the operational performance.

The present invention relates to a semiconductor memory device which shares a single chip for its use by switching for the one-bit input and output mode and the multi-bit input and output mode, and enables the memory write masking. In the present invention, each of a plurality of write amplifiers, which execute a data write to a memory cell array, is connected to a write data line that transmits a write data and a write amplifier enable signal line that controls the activation of the write amplifier to receive inputs from these two lines. In addition, there is provided means for inputting a write mask data specifying a write mask for every bit to a write amplifier via a write amplifier enable signal line for the case of multi-bit configuration.

In the semiconductor memory device of the present invention, it is preferable to be equipped with means for receiving a control signal that specifies the one-bit configuration and the multi-bit configuration, and a selection circuit which, in response to the control signal, selects one write amplifier enable signal line that is designated by the address signal for the case of one-bit configuration, and outputs on the write amplifier enable signal lines a write mask data that consists of binary information with the same number as the write amplifier enable signal lines that are externally input, for the case of multi-bit configuration.

Moreover, for the semiconductor memory device of the present invention it is preferable to provide a write mask decoder which activates one of the write amplifier enable signal lines by decoding the address signals for the one-bit configuration, and outputs a write mask data input externally, as it is, on the write amplifier enable signal lines for the multi-bit configuration.

Furthermore, for the semiconductor memory device of the present invention it is preferable to provide a write mask decoder which decodes the address signals to activate one of the outputs only when it is in the one-bit configuration, and a selector which selects an activated output and sends it out to a write amplifier enable signal line for the one-bit configuration, and sends out a write mask data externally input to the write amplifier enable signal lines for the multi-bit configuration.

In accordance with the present invention the number of signal lines for controlling the write amplifiers can be reduced. Accordingly, the area to be used for the wiring can be reduced, and the miniaturization and the enhancement of the operational performance of the semiconductor memory device can be achieved.

BRIEF DESCRIPTION OF THE DRAWINGS

The above-mentioned and other objects, features and advantages of this invention will become more apparent from the following detailed description of the invention taken in conjunction with the accompanying drawings, wherein.

DETAILED DESCRIPTION OF THE INVENTION

Prior to the description of the embodiments in accordance with the present invention, a general description of the switching of the connection between the one-bit configuration and the multi-bit configuration and the write mask function of the semiconductor memory device, and a description of the prior art memory write mask system are in order.

Figure 1A:
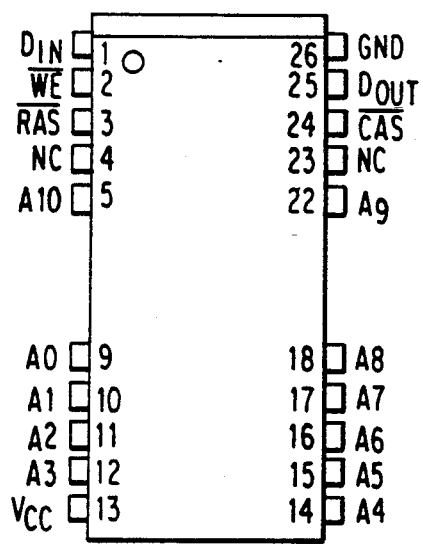
FIGS. 1(A) and 1(B) shows the pin arrangement of a 4-megabit dynamic random access memory (DRAM)
Figure 1B:
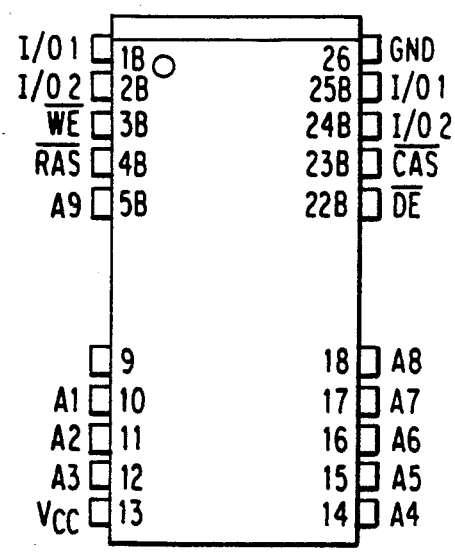

FIGS. 1(A) and FIG. 1(B) show pin arrangements of a semiconductor memory device which makes a shared use of a chip, and makes it possible to go to a one-bit configuration (FIG. 1(A)) and a multi-bit configuration (FIG. 1(B)) by switching the connection between external terminals and lead frames.

In FIG. 1(A), address input signals $A_0$ to $A_{10}$ applied to pin 9 to pin 12, pin 14 to pin 18, pin 22 and pin 5 are made effective in time series, and made to become a column address and a row address by a column address strobe signal $\overline{CAS}$ that is applied to 24 and a row address signal $\overline{RAS}$ applied to pin 3, respectively. A write amplifier enable signal $\overline{WE}$ applied to pin 2 designates the difference between the write operation to the memory cell array and the read operation from the memory cell array. In the case of the write operation, a data input signal $D_{IN}$ applied to the pin 1 is written to the memory cell array, while in the case of the read operation, a data output signal $D_{OUT}$ is read out from the memory cell array at the pin 25. As a result, the device operates as a semiconductor memory device of one-bit configuration with $10^{22}$ addresses $\times 1$ bit.

In FIG. 1(B), the pin arrangement for the upper half part of the figure differs from that of FIG. 1(A). Namely, since the pin 22 in FIG. 1(A) is replaced in FIG. 1(B) by a pin 22B of output enable signal $\overline{OE}$, the address input signal for this case becomes 10 bits of $A_0$ to $A_9$. However, each of the terminals 1 and 25 for the data input signal $D_{IN}$ and the data output signal $D_{OUT}$, respectively, in FIG. 1(A) is used in FIG. 1(B) commonly for the input and the output, and by providing terminals 1B, 2B, 24B and 25B for altogether four data input and output signals $I/O_1$ to $I/O_4$, simultaneous input or output of 4 bits becomes possible. The difference between the write operation and the read operation is designated by the output enable signal $\overline{OE}$ (pin 22A). As a result, the device operates as a semiconductor memory device of multi-bit configuration with $10^{20}$ addresses $\times 4$ bits.

The one-bit configuration and the multi-bit configuration in the above can be effected by a simple switching of the lead frame connections for the pins of the semiconductor memory device without involving any change in the internal configuration of the device.

Next, referring to FIG. 2, the function of the write mask will be described.

It is to be noted that what is called the data input terminals for X4 configuration correspond to the pins 1B, 2B, 24B and 25B for the data input and output signals of the semiconductor memory device of the four-bit configuration shown in FIG. 1 (B). Since the write operation will be described in what follows, these terminals will function as the data input terminals.

First, a signal data applied to the data input terminals for X4 configuration of the semiconductor memory device at the time when a control signal $\phi 1$ went from the level "1" to the level "0" is latched as a write mask data. In addition, a signal data applied to the data input terminals for X4 configuration of the semiconductor memory device at the time when a control signal $\phi 2$ goes from "1" to "0" is latched as a write data for writing. If a write mask data which is input to the same input terminal is "1", the write data will be written to the memory cell array while if it is "0", the write data will not be written to the memory cell array. The write mask function operates for every bit of a data so that it will be meaningless unless the semiconductor memory device is of the multi-bit input and output configuration.

Figure 3:
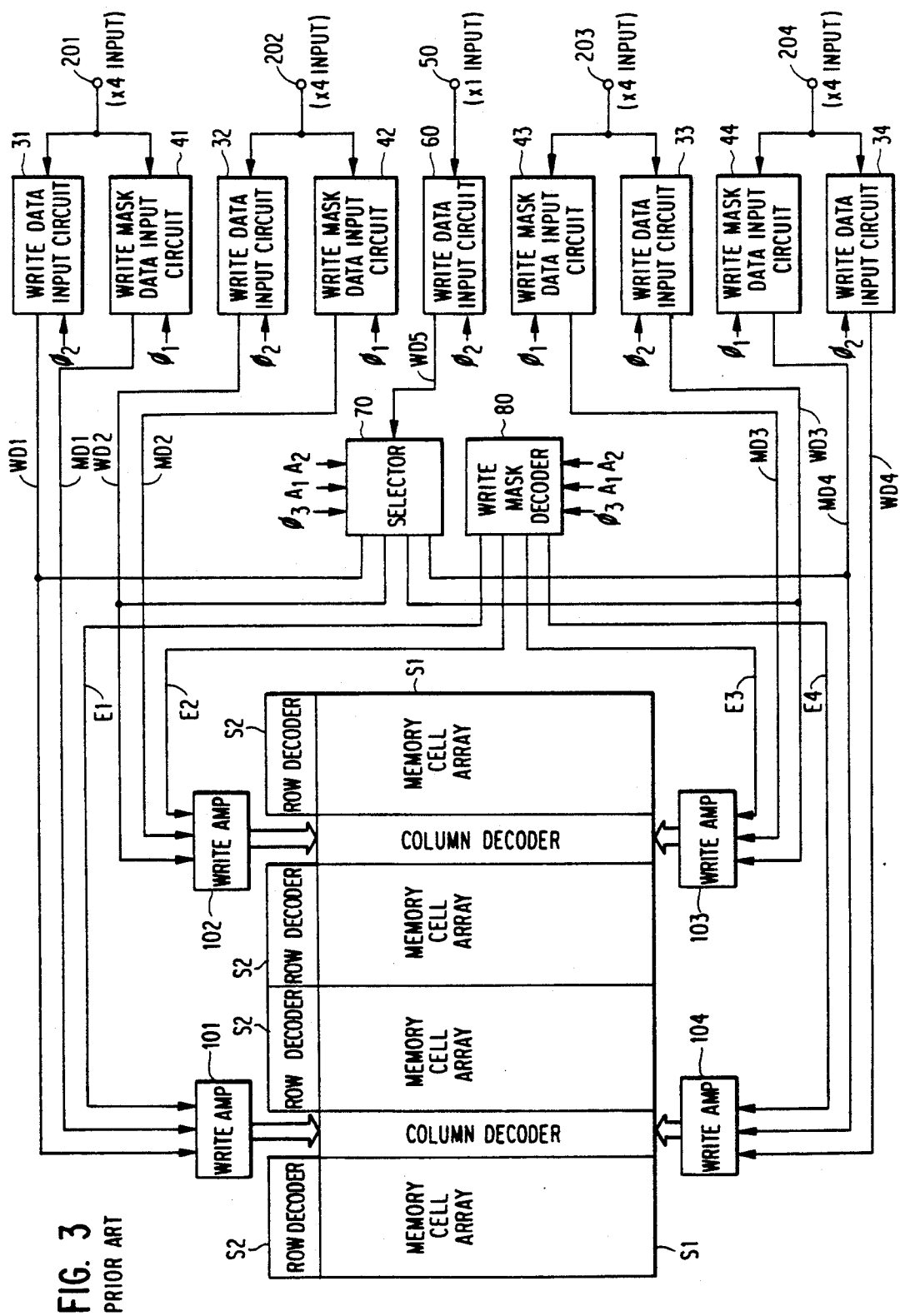
FIG. 3 shows a block diagram of the prior art.

Referring to FIG. 3, the prior art memory write mask system in a semiconductor memory device which makes the multi-bit configuration operative and has the write mask function will be described.

FIG. 3 shows a block diagram for the parts that are related only to the write operation of the memory.

A memory cell array S1 is divided into four sections in order to permit a simultaneous operation at the time of the X4 configuration. The row decoders S2 and the column decoders S3 decode the input address signals for the one-bit configuration or the four-bit configuration in response to the row address strobe signal $\overline{RAS}$ and the column address strobe signal $\overline{CAS}$, respectively, to drive the row address lines and the column address lines of the memory cell array S1.

The write amplifiers 101 to 104 are for writing data to the memory cells that are selected as in the above, the reason for having four amplifiers being to be able to handle the case of the four-bit configuration. When a control signal $\phi 3$ is "0", that is, when the device is in the one-bit configuration, a selector 70 selects one of the four write data lines WD1 to WD4 using the input address signals $A_1$ and $A_2$, and connects the selected line to a write data line WD5. The control signal $\phi 3$ is usually generated by a known programmable circuit means such as a fuse. Further, when the control signal $\phi 3$ is "1", that is, when the device is in the four-bit configuration, the device is operated so as to connect the write data line WD5 to none of the write data lines WD1 to WD5.

A write data input circuit 60 supplies a write data input from a data input terminal 50 for X1 (namely, one-bit) configuration to the write data line WD5 in response to the control signal $\phi 2$ for data fetching. The four write data input circuits 31 to 34 supply the write data that are input through data input terminals 201 to 204 for the X4 configuration to write data lines WD1 to WD4, respectively, in response to the control signal $\phi 2$.

The four write mask data input circuits 41 to 44 supply write mask data that are input through data input terminals 201 to 204 for the X4 configuration to write mask data lines MD1 to MD4, respectively in response to the write mask data fetching control signal $\phi 1$. A write mask decoder 80 sets only one line among four write amplifier enable signal lines E1 to E4 to "1" by decoding the input address signals $A_1$ and $A_2$ when the control signal $\phi 3$ is "0", and sets all of the write amplifier enable signal lines E1 to E4 to "1" when the control signal $\phi 3$ is "1".

Figure 4:
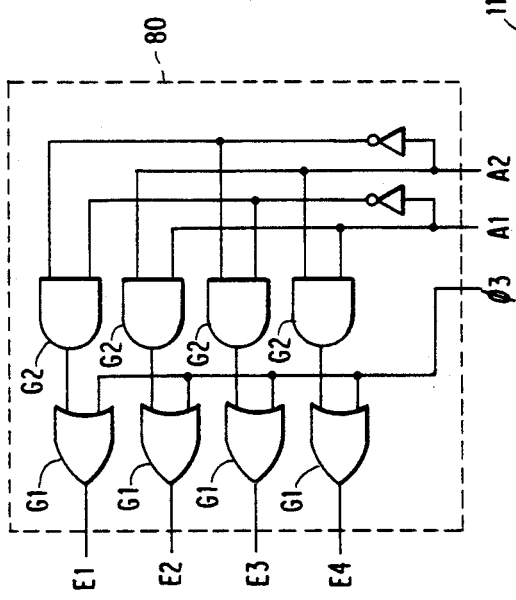
FIG. 4 shows a logic gate diagram of the write mask decoder in FIG. 3.

In FIG. 4 the logic gate configuration of the write mask decoder 80 is shown. When the control signal $\phi 3$ is "1", all of the four two-input OR gates G1 output "1" so that all of the four write amplifier enable signal lines E1 to E4 go to "1". On the other hand, when the control signal $\phi 3$ is "0", the outputs of the four of the two-input AND gates G2 are output to the write amplifier enable signal lines E1 to E4. The four of the two-gate AND gates G2 and the two inverters G3 decode the input address signals $A_1$ and $A_2$, and output "1" from only one of the two-input AND gates G2 and "0" from the remaining two-input AND gates G2.

Thus, referring to FIG. 3, the control signal $\phi 3$ goes to "0" at the time of one-bit configuration, either one of the write amplifier enable signal lines E1 to E4 is set to "1" by the write mask decoder 80 in response to the input address signals $A_1$ and $A_2$, and only the write amplifier 101, for example, connected to that particular line is activated. Then, the write data line WD1 connected to the activated write amplifier 101 and the write data line WD5 are connected by the selector 70, and the data in the write data line WD5 is written to the memory cell array by the activated write amplifier 101.

Further, at the time of the four-bit configuration the control signal goes to "1", all of the write amplifier enable signal lines E1 to E4 go to "1", whereby activating all of the write amplifiers 101 to 104. If then the write mask data lines MD1 to MD4 are "1", the data in the write data lines WD1 to WD4 that are in the paired relation by being connected to the write amplifiers 101 to 104 with the same number of bits are written to the memory cell arrays. On the other hand, if the write mask data lines MD1 to MD4 are "0", the data in the write data lines WD1 to WD4 are not written to the memory cell, whereby effecting the write masking.

Figure 5:
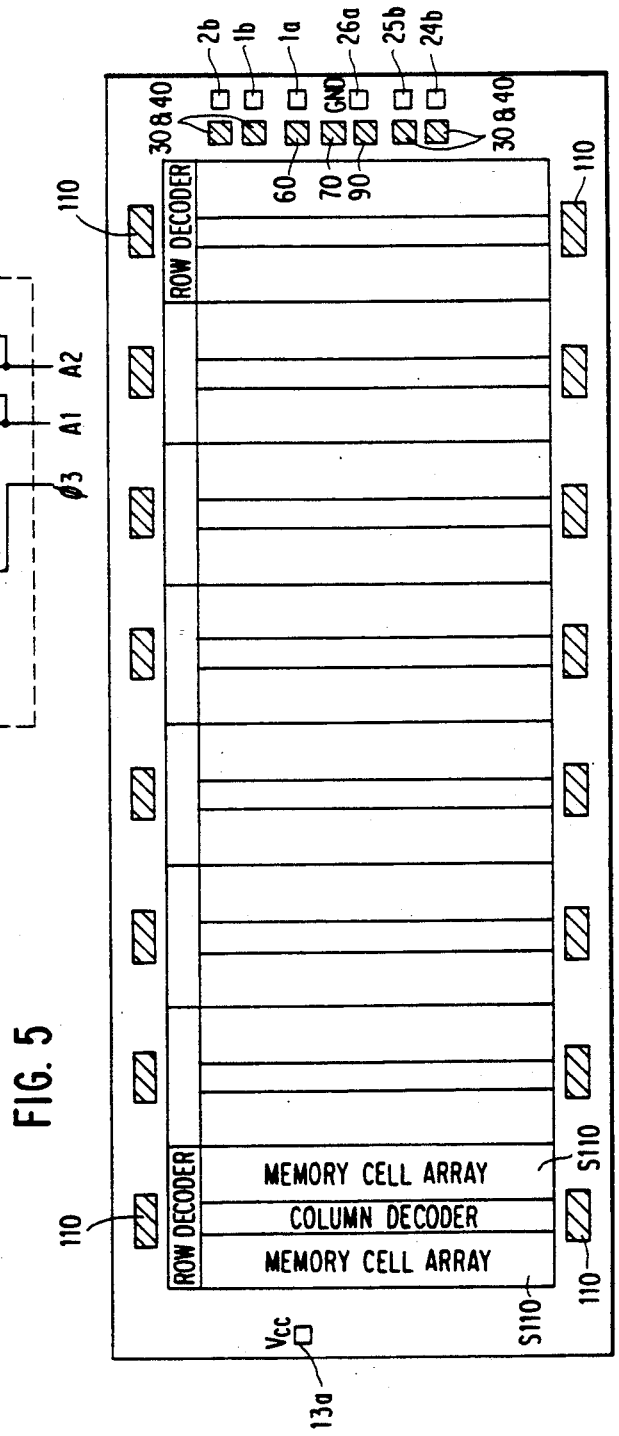
FIG. 5 shows the layout of a 4-megabit DRAM.

FIG. 5 shows the circuit layout on the common chip for the 4 megabit DRAM in FIG. 1. The figure sketches the outline of the actual product, with the size ratio of the long and short sides being substantially equal to the true value of the actual product. (Note that terminals that are not needed for the description are dropped from the figure.) In this example 16 write amplifiers 110 are uniformly disposed along both sides of the memory cell arrays S110 that consist of 16 parts in all. In this arrangement, the selector 70 selects one of 16 write amplifiers 110 in the X1 input configuration and selects four of the 16 write amplifiers simultaneously in the X4 input configuration. In the right-hand end section along the short side of the chip there are compactly arranged a data input terminal 1a for the X1 configuration, data input terminals 1b, 2b, 24b and 25b for the X4 configuration, a write data input circuit 60, integrated units of a data input circuit 30 and a write mask data input circuit 40, a selector 70 and a mask decoder 90. Accordingly, it will be easily understood that the separation between the write mask data input circuit 40 and the write mask decoder 90 is smaller than the separation between the write mask data input circuit 40 and the write amplifier 110.

If it is assumed that the prior art memory write device in FIG. 3 is applied to the memory in FIG. 5, the write mask data lines MD1 to MD4 that connect the write mask data input circuit 40 and the write amplifiers 110 have to be run over fairly long distances, which requires an accordingly large wiring area. This becomes, therefor, a big obstacle to the miniaturization effort for the chip. Further, in this case, the write data lines WD1 to WD4 and the write amplifier enable signal lines E1 to E4 in addition to the write mask data lines MD1 to MD4 enter the write amplifiers 110. Moreover, these lines run adjacent with each other for a relatively long distance so that the parasitic capacitance is increased and consequently the operational performance of the chip will be deteriorated.

Next, the embodiments of the present invention will be described.

Figure 6:
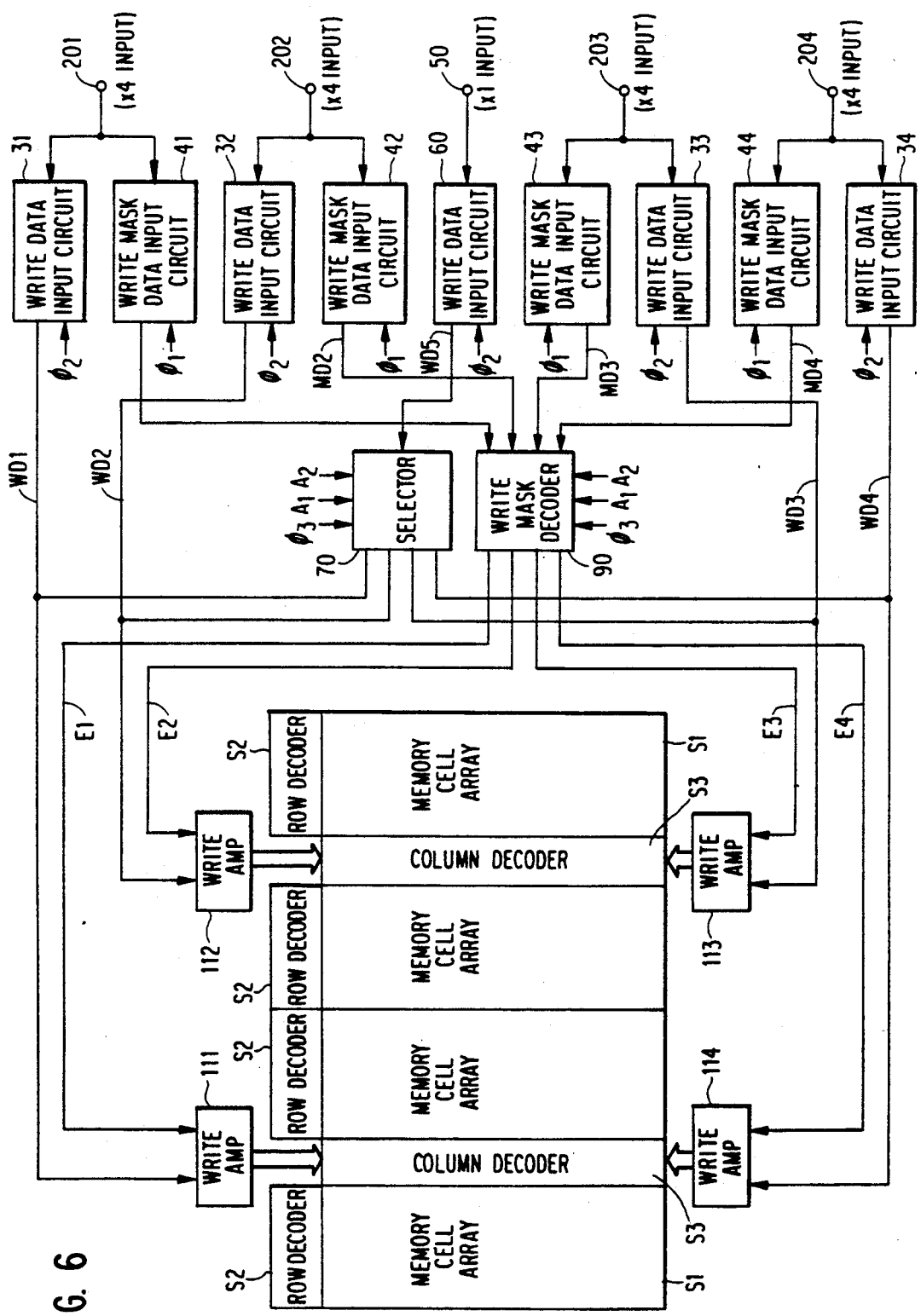
FIG. 6 shows a block diagram for the semiconductor memory device in accordance with a first embodiment of the present invention.

FIG. 6 is a block diagram showing the semiconductor memory device according to a first embodiment of the present invention. In the description, the components identical to those in the prior art device are assigned the identical symbols to avoid the duplication of the explanation, with only characteristic features being described.

Figure 2:
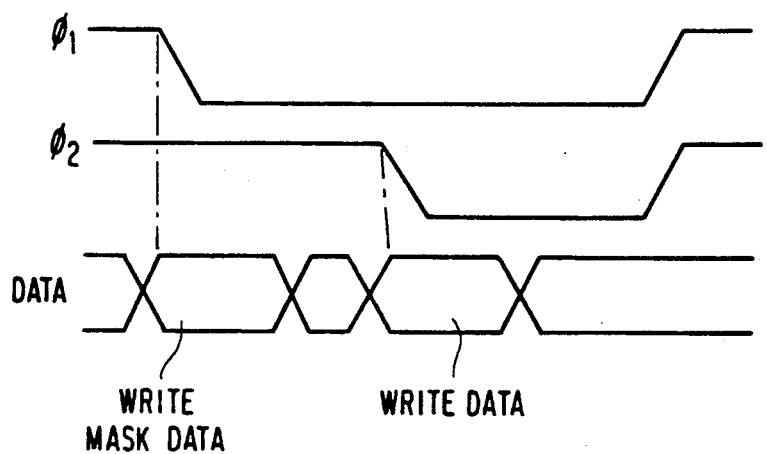
FIG. 2 shows a voltage waveform diagram for explaining the write mask function.

Further, when the present semiconductor memory device is applied to a 4 megabit memory, the pin arrangement, the write mask function and the circuit layout on the chip are as shown in FIG. 1, FIG. 2 and FIG. 5, respectively.

In the present invention, the write mask data lines MD1 to MD4 from the write mask data input circuits 41 to 44 are connected to the write mask decoder 90, and the write mask data on the lines MD1 to MD4 are input to write amplifiers 111 to 114 by the write amplifier enable signal lines E1 to E4 leading from the write mask decoder 90 to the write amplifiers 111 to 114. Namely, the write mask data lines MD1 to MD4 and the write amplifier enable signal lines E1 to E4 are serially connected via the write mask decoder 90.

The write mask decoder 90 selects one line among the write amplifier enable signal lines E1 to E4 by decoding the input address signals $A_1$ and $A_2$ and outputs "1" at the time of the one-bit configuration, and outputs the write mask data on the signal lines MD1 to MD4 to the write amplifier enable signal lines E1 to E4 for all times regardless of the values of the input address signals $A_1$ and $A_2$ at the time of four-bit configuration.

As a result, the write amplifiers 111 to 114 are controlled by the write amplifier enable signal lines E1 to E4 alone. It is to be noted that this control operates under the same logic as that of the direct control by the write mask data lines MD1 to MD4 and the write amplifier enable signal lines E1 to E4 in FIG. 3. In this embodiment, the control signal $\phi 3$ may be generated by a known programmable circuit means such as disclosed in U.S. Pat. No. 4,571,707 issued to Watanabe. As the write amplifiers 111~114, the amplifier such as disclosed in U.S. Pat. No. 4,669,064 issued to Ishimoto may be utilized.

Figure 7:
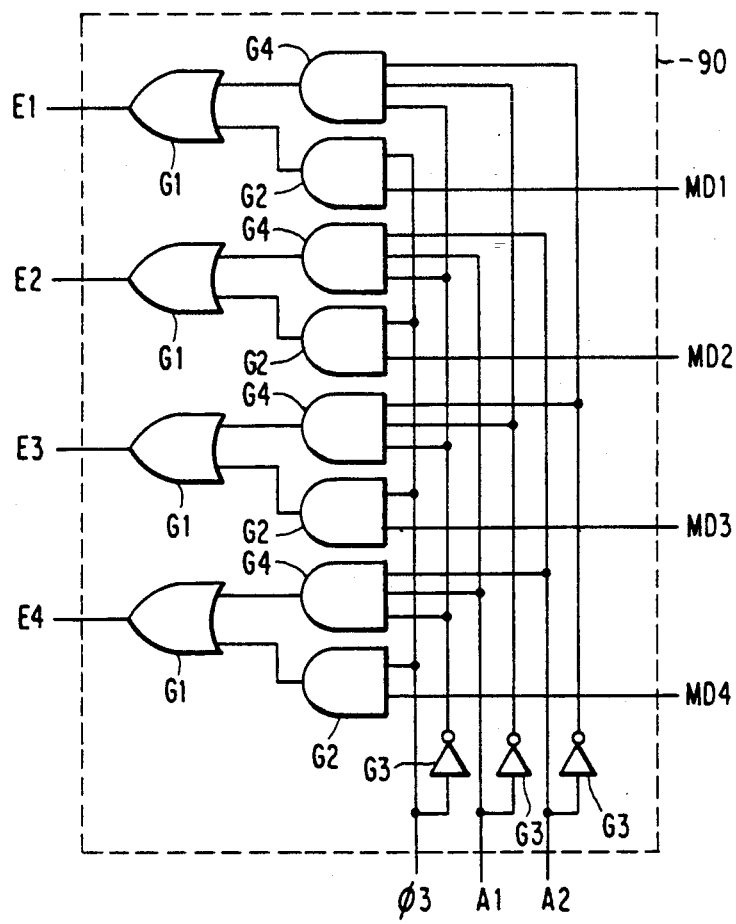
FIG. 7 shows a logic gate diagram of the write mask decoder in FIG. 6.

FIG. 7 shows the logic gate configuration of the write mask data decoder 90. In the figure, G4 is a three-input AND gate, and the remaining components are the same as shown in FIG. 4. As may be clear from the figure, the decoder 90 outputs the values of the write mask data lines MD1 to MD4 to the write amplifier enable signal lines E1 to E4 when the control signal $\phi 3$ is "1", and outputs "1" only to one line among E1 to E4 and "0" to the remainder depending upon the values of the input address signals $A_1$ and $A_2$ when the control signal $\phi 3$ is "0".

Namely, in FIG. 6, at the time of the four-bit configuration the control signal $\phi 3$ becomes "1", and if the write mask data lines MD1 to MD4 are "1", the corresponding write amplifier enable signal lines E1 to E4 also become "1" via the write mask decoder 90, and the data of the write data lines WD1 to WD4 that are paired with the data lines MD1 to MD4 are written to the memory cell arrays S1 by the activated write amplifiers 111 to 114.

Further, even when the control signal $\phi 3$ is "1", if the write mask data lines MD1 to MD4 are "0", the corresponding write amplifier enable signal lines E1 to E4 also become "0" via the write mask decoder 90, and the data of the write data lines WD1 to WD4 are not write to the memory cell arrays whereby effecting the write masking.

On the other hand, at the time of the one-bit configuration the control signal $\phi 3$ becomes "0", one of the four write amplifier enable signal lines E1 to E4 is set to "1" by the input address signals $A_1$ and $A_2$, and only the connected one 111, for example, of the write amplifiers is activated. Then, the write data line WD5 is connected by the selector 70 to the write data line WD1 that is connected to the write amplifier 111, and the data of the write data line WD5 is written to the memory cell array.

Figure 8:
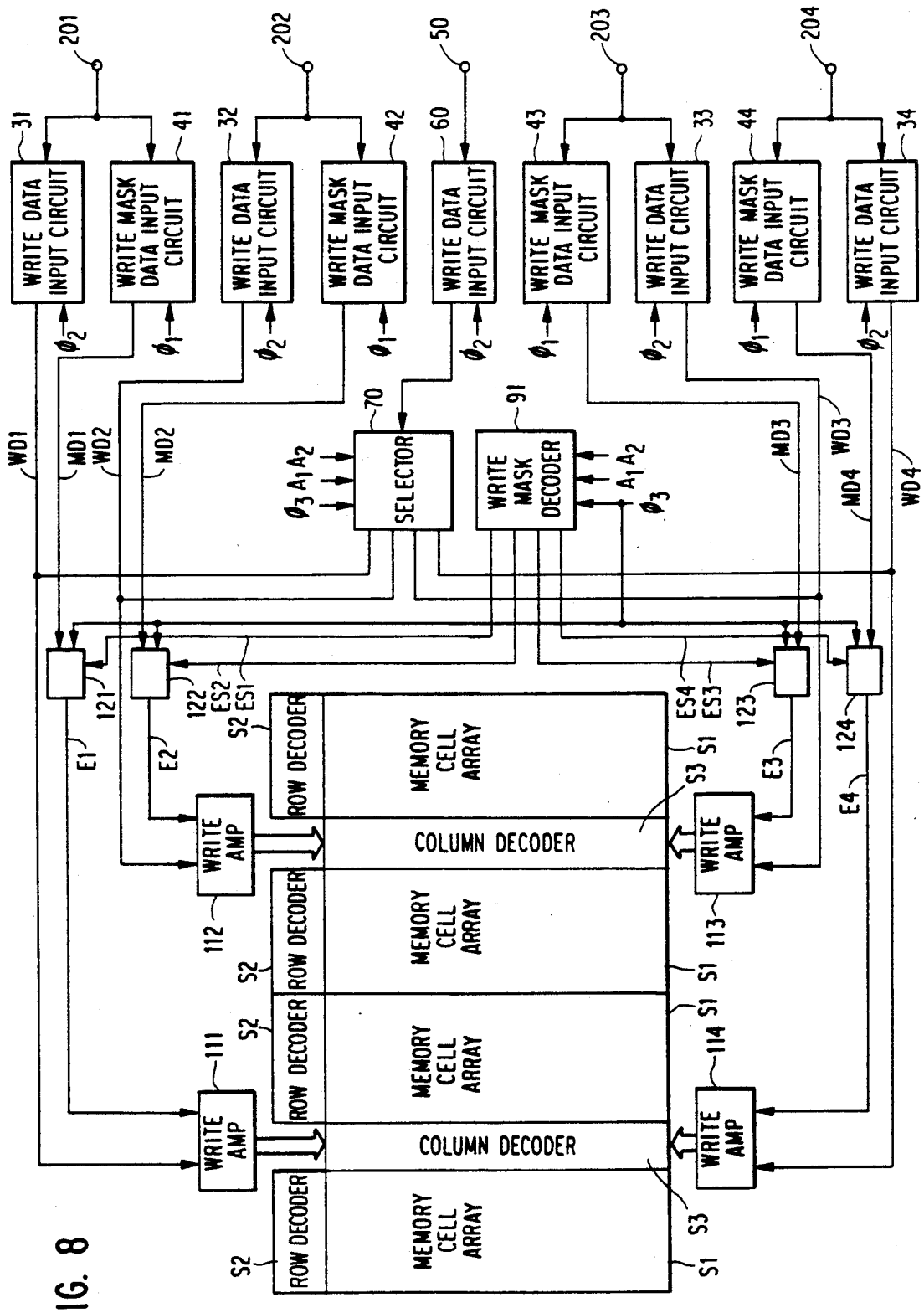
FIG. 8 shows a block diagram for the semiconductor memory device in accordance of a second embodiment of the present invention.

FIG. 8 is a block diagram for the semiconductor memory device in accordance with a second embodiment of the present invention. It is to be noted that the components identical to those of the prior art device and the first embodiment are assigned the identical symbols to avoid a duplicated explanation, and the characteristic features alone of the present embodiment will be described.

In the present embodiment, four selectors 121 to 124 are provided, and the write mask data lines MD1 to MD4 from the corresponding write mask data input circuits 41 to 44 are connected to the selectors 121 to 124, respectively. Analogous to the prior art write mask decoder 80 shown in FIG. 3, a write mask decoder 91 is controlled by the control signal $\phi 3$ and decodes the input address signals $A_1$ and $A_2$, but its outputs are introduced to the corresponding newly provided selectors 121 to 124 through the signal lines ES1 to ES4.

Each of the selectors 121 to 124 selects one of the write mask data lines MD1 and the like and the signal lines ES1 and the like by the control of the control signal $\phi 3$, and inputs the signal to the corresponding one of the write amplifiers 111 to 114 by connecting the selected line to the corresponding write amplifier enable signal lines E1 and the like. Since the selectors 121 to 124 can be arranged at substantially the same positions of the write data input circuit 30 and the write mask data input circuit 40 on the circuit layout in FIG. 5, the write mask data lines MD1 to MD4 and the signal lines ES1 to ES4 in FIG. 8 can be made relatively short.

Although the invention has been described with reference to specified embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments that fall within the true scope of the invention.

Figure 9:
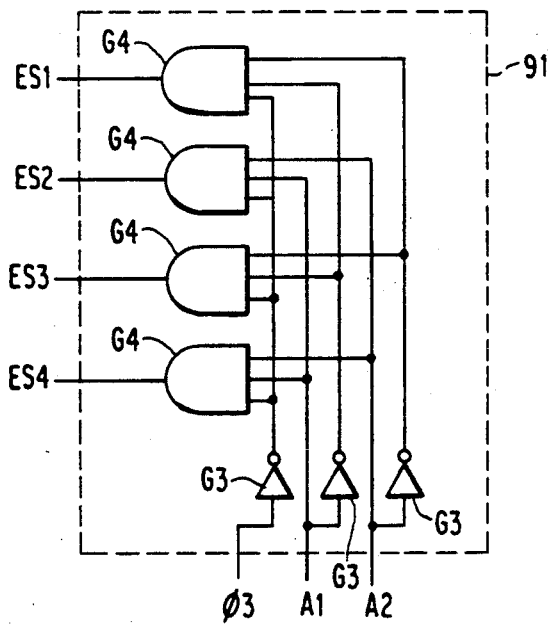
FIG. 9 shows a logic gate diagram of the write mask decoder in FIG. 8.

In FIG. 9 is shown the logic gate configuration of the write mask decoder 91. In the decoder 91 one of the signal lines ES1 to ES4 is set to "1" by the input address signals $A_1$ and $A_2$ when the control signal $\phi 3$ is "0", and all of the signal lines are set to "0" when the control signal $\phi 3$ is "1".

Figure 10:
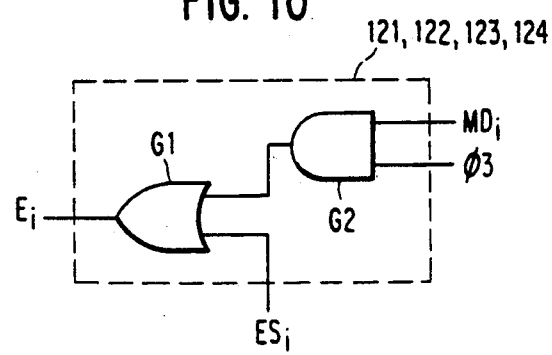
FIG. 10 shows a logic gate diagram of the selector in FIG. 8.

In FIG. 10 is shown the logic gate configuration of the selectors 121 to 124. In the figure the subscript i on the symbols takes on the values 1 to 4. With these selectors, when the control signal $\phi 3$ is "0", the values of the signal lines ES1 to ES4 are output as they are to the write amplifier enable signal lines E1 to E4, and when the control signal $\phi 3$ is "1", the values of the write mask data lines MD1 to MD4 are output as they are to the write amplifier enable signal lines E1 to E4.

With the device as shown in FIG. 8 an operation similar to the embodiment shown in FIG. 6 can be obtained.

In the present embodiment there can be obtained an advantage that the number of wirings can be reduced without requiring to lead the write mask data lines MD1 to MD4 to the write mask decoder 91.

In the present embodiment the write amplifier enable lines and the write mask data lines are serially connected so that the number of the input signal lines for the write amplifiers can be reduced to two-thirds. That is, in the past, the write data lines, the write amplifier enable signal lines and the write mask data lines were connected to the write amplifiers, but in the present invention it is only needed to connect the write data lines and the write amplifier enable signal lines. Moreover, each of these input signal lines are required for the same number as the number of the write amplifiers so that the absolute number that can be reduced can be made to be equal to that of the write amplifiers.

Each of the above-mentioned input signal lines becomes relatively long due to the circuit layout of the semiconductor memory device so that the line arrangement area can be reduced by the decrease in their number, which brings about a significant effect in the attempt to miniaturize the semiconductor memory device. Moreover, the reduction in the parasitic capacitance will enhance the operational performance of the device. For example, when the present invention is applied to a semiconductor memory device with chip size of 16 mm×6 mm and a wiring pitch of 4 $\mu$m, the wiring area can be reduced from 3840 $\mu m^2$ to 3584 $\mu m^2$ and the parasitic capacitance can be reduced by 16 pF.

What is claimed is:

1. A semiconductor memory device operable in a one-bit input and output mode as well as multi-bit input and output mode, and for execution of a memory write masking function, said semiconductor memory device comprising:

a memory cell array subdivided spatially into a plurality of memory cell array parts;

a plurality of write amplifiers for operatively performing a data write operation to said memory cell array, the number of write amplifiers included being equal to that of the number of said memory cell array parts, and the write amplifiers being arranged in the vicinity of the respective memory cell array parts;

a plurality of write data lines, each being connected to one of said write amplifiers for supplying a write data thereto;

a plurality of write amplifier enable signal lines, each being connected to one of said write amplifiers for controlling the activation of said write amplifier;

receiving means for receiving external write mask data designating a write mask for each bit at the time of said multi-bit input and output mode configuration;

supply means, connected to said receiving means and said write amplifier enable signal line, for supplying said external write mask data received by said receiving means to said write amplifier enable signal lines at the time of said multi-bit input and output mode configuration, said supply means being arranged in the vicinity of said receiving means, said supply means including selection means for selecting one of said write amplifier enable signal lines at the time of said one-bit input and output mode configuration and for outputting said write mask data to said write amplifier enable signal lines at the time of said multi-bit input and output mode configuration, said selection means including a write mask decoder which decodes external address signals and activates one of said write amplifier enable signal lines at the time of said one-bit input and output mode configuration, and outputs said write mask data from said receiving means to said write amplifier enable signal lines at the time of said multi-bit input and output mode configuration; and means for receiving a control signal for designating the difference between said one-bit input and output mode configuration and said multi-bit input and output mode configuration.

2. A semiconductor memory device operable in a one-bit input and output mode as well as multi-bit input and output mode, and for execution of a memory write masking function, said semiconductor memory device comprising:

a memory cell array subdivided spatially into a plurality of memory cell array parts;

a plurality of write amplifiers for operatively performing a data write operation to said memory cell array, the number of write amplifiers included being equal to that of the number of said memory cell array parts, and the write amplifiers being arranged in the vicinity of the respective memory cell array parts;

a plurality of write data lines, each being connected to one of said write amplifiers for supplying a write data thereto;

a plurality of write amplifier enable signal lines, each being connected to one of said write amplifiers for controlling the activation of said write amplifier;

receiving means for receiving external write mask data designating a write mask for each bit at the time of said multi-bit input and output mode configuration;

supply means, connected to said receiving means and said write amplifier enable signal line, for supplying said external write mask data received by said receiving means to said write amplifier enable signal lines at the time of said multi-bit input and output mode configuration, said supply means being arranged in the vicinity of said receiving means, said supply means including selection means for selecting one of said write amplifier enable signal lines at the time of said one-bit input and output mode configuration and for outputting said write mask data to said write amplifier enable signal lines at the time of said multi-bit input and output mode configuration, said selection means including a write mask decoder which decodes external address signals and activates one of said write amplifier enable signal lines at the time of said one-bit input and output mode configuration, and a selector which sends said activated output to said write amplifier enable signal line at the time of said one-bit input and output mode configuration and sends said write mask data from said receiving means to said write amplifier enable signal lines at the time of said multi-bit input and output mode configuration; and means for receiving a control signal for designating the difference between said one-bit input and output mode configuration and said multi-bit input and output mode configuration.

3. A memory write mask system for a semiconductor memory device having a one-bit input and output mode and a multi-bit input and output mode, said memory write mask system including write amplifiers for executing a data write, a memory cell array, write amplifier enable signal lines and write data lines, said memory write mask system receiving a control signal and address signals, said memory write mask system comprising:

means for connecting, to each of said write amplifiers for executing data write to said memory cell array, one of said write data lines for transmitting write data and one of said write amplifier enable signal lines for controlling the activation of said write amplifier; and input means for inputting write mask data, designating a write mask for every bit, to said write amplifiers by means of said write amplifier enable signal lines at the time of said multi-bit input and output mode configuration, said input means comprising selection means for providing said write mask data on said write amplifier enable signal lines, said selection means outputting pieces of binary information equal in number to that of said write amplifier enable signal lines in response to said control signal which designates either one of said one-bit input and output mode configuration and said multi-bit input and output mode configuration, said address signals which designate one of said write amplifier enable signal lines at the time of said one-bit input and output mode configuration, and said write mask data, said selection means being constructed by a write mask decoder which activates one of said write amplifier enable signal lines by decoding said address signals at the time of said one-bit input and output mode configuration, and outputs said write mask data at the time of said multi-bit input and output mode configuration.

4. A memory write mask system for a semiconductor memory device having a one-bit input and output mode and a multi-bit input and output mode, said memory write mask system including write amplifiers for executing a data write, a memory cell array, write amplifier enable signal lines and write data lines, said memory write mask system receiving a control signal and address signals, said memory write mask system comprising:

means for connecting, to each of said write amplifiers for executing data write to said memory cell array, one of said write data lines for transmitting write data and one of said write amplifer enable signal lines for controlling the activation of said write amplifier; and input means for inputting write mask data, designating a write mask for every bit, to said write amplifiers by means of said write amplifier enable signal lines at the time of said multi-bit input and output mode configuration, said input means comprising selection means for providing said write mask data on said write amplifier enable signal lines, said selection means outputting pieces of binary information equal in number to that of said write amplifier enable signal lines in response to said control signal which designates either one of said one-bit input and output mode configuration and said multi-bit input and output mode configuration, said address signals which designate one of said write amplifier enable signal lines at the time of said one-bit input and output mode configuration, and said write mask data, said selection means comprising:

a write mask decoder having a plurality of outputs, said write mask decoder activating one of the outputs by decoding said address signals only at the time of said one-bit input and output mode configuration, and a selector which respectively sends said activated output at the time of said one-bit input and output mode configuration, and sends said write mask data at the time of said multi-bit input and output mode configuration to said write amplifier enable signal lines.

* * * * *